(12) United States Patent
Tian et al.

(10) Patent No.: US 11,380,876 B2
(45) Date of Patent: Jul. 5, 2022

(54) DISPLAY SUBSTRATE, METHOD FOR MANUFACTURING THE SAME AND DISPLAY DEVICE

(71) Applicant: BOE TECHNOLOGY GROUP CO., LTD., Beijing (CN)

(72) Inventors: Hongwei Tian, Beijing (CN); Yanan Niu, Beijing (CN); Dong Li, Beijing (CN); Ming Liu, Beijing (CN); Zheng Liu, Beijing (CN); Chunyang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 150 days.

(21) Appl. No.: 16/563,214

(22) Filed: Sep. 6, 2019

(65) Prior Publication Data
US 2020/0287167 A1    Sep. 10, 2020

(30) Foreign Application Priority Data

Mar. 8, 2019   (CN) .......................... 201910175947.9

(51) Int. Cl.
*H01L 51/52*  (2006.01)
*H01L 27/32*  (2006.01)

(52) U.S. Cl.
CPC ...... *H01L 51/5284* (2013.01); *H01L 27/3211* (2013.01); *H01L 27/3246* (2013.01)

(58) Field of Classification Search
None
See application file for complete search history.

(56) References Cited

U.S. PATENT DOCUMENTS

| 9,385,343 | B2* | 7/2016 | Li | H01L 51/5284 |
|---|---|---|---|---|
| 10,826,016 | B2* | 11/2020 | Jin | H01L 51/5284 |
| 2015/0364725 | A1* | 12/2015 | Li | H01L 51/5284 257/40 |
| 2018/0203562 | A1* | 7/2018 | An | G06F 1/3218 |
| 2019/0207135 | A1* | 7/2019 | Kristal | G02F 1/13306 |

(Continued)

FOREIGN PATENT DOCUMENTS

| CN | 104037358 A | 9/2014 |
|---|---|---|
| CN | 104576679 A | 4/2015 |
| CN | 106252380 A * | 12/2016 |

(Continued)

OTHER PUBLICATIONS

Second Office Action, Republic of China (Year: 2021).*

(Continued)

*Primary Examiner* — Telly D Green
(74) *Attorney, Agent, or Firm* — Nath, Goldberg & Meyer; Joshua B. Goldberg

(57) ABSTRACT

The disclosure provides a display substrate, a method for manufacturing the same and a display device, belonging to the display technology field, to solve the problem that ultraviolet irradiation has an adverse effect on the service life of existing OLED devices. The display substrate disclosed herein includes a light processing layer which comprising a condensed-ring conjugated polymer. The light processing layer can protect the display parts below it and prevent the display parts from being exposed to ambient light and reducing their service life.

13 Claims, 5 Drawing Sheets

(56) References Cited

U.S. PATENT DOCUMENTS

2019/0326552 A1* 10/2019 Jin .................... H01L 51/56
2020/0328357 A1* 10/2020 Lee .................. H01L 51/0068

FOREIGN PATENT DOCUMENTS

| CN | 107249053 A | * | 10/2017 |
| CN | 108230908 A | | 6/2018 |
| CN | 108598278 A | | 9/2018 |
| CN | 108807473 A | * | 11/2018 |

OTHER PUBLICATIONS

Gao et al. "Asymmetrical Small Molecule Acceptor Enabling Non-fullerene Polymer Solar Cell with Fill Factor Approaching 79%", ACS Energy Letters, 2018, pp. 1760-1768. (Year: 2018).*
First Office Action dated Jul. 17, 2020 for application No. CN201910175947.9 with English Translation attached.

* cited by examiner

DISPLAY SUBSTRATE, METHOD FOR MANUFACTURING THE SAME AND DISPLAY DEVICE

CROSS REFERENCE TO RELATED APPLICATION

This application claims the priority of Chinese Patent Application No. 201910175947.9, filed on Mar. 8, 2019, entitled "A Display Substrate, Preparation Method thereof, and Display Device", which is hereby incorporated into this application by reference in its entirety.

TECHNICAL FIELD

The present disclosure relates to the field of display technology, particularly to a display substrate and a method for manufacturing the same, as well as a display device including the display substrate.

BACKGROUND

Organic Electroluminescent Display (OLED), with its low power consumption, high color saturation, wide viewing angle, thin thickness, achievability of flexibility and other excellent performance, has gradually become the mainstream in the display field, and is widely used in smartphones, tablets, televisions and other terminal products.

At present, due to the inherent characteristics of the material that forms OLED, the lifetime of OLED devices will be affected to some extent when exposed to light, especially ultraviolet light, thereby affecting the long-term application of OLED products, such as OLED mobile phone or watch, etc., in outdoor or strong light.

SUMMARY

Aiming at the problem of adverse impact of exposure of light, especially ultraviolet light, on the service life of existing OLED devices, the present disclosure provides a display substrate and a method for manufacturing the same, as well as a display device including the display substrate.

The present disclosure provides a display substrate comprising a base substrate, a pixel layer comprising multiple sub-pixel units on a side of the base substrate, and a light processing layer comprising a condensed-ring conjugated polymer at least on a side of the pixel layer away from the base substrate; wherein the light processing layer allows light emitted by sub-pixel units at corresponding positions to pass through and prevents at least partially other light.

Optionally, a control circuit layer is arranged between the base substrate and the pixel layer, and a light processing layer is disposed on a side of the control circuit layer towards the pixel layer.

Optionally, the condensed-ring conjugated polymer includes a polymer containing nonfullerene.

Optionally, the display substrate is an OLEO substrate, and the light processing layer includes an ultraviolet absorption layer. The ultraviolet absorption layer may be used to prevent ultraviolet light.

Optionally, the polymer containing nonfullerene of the ultraviolet absorption layer has an ultraviolet absorption group. The ultraviolet absorption group includes at least one of an amino acid group, a tryptophan group, a tyrosine group and a conjugated double-chain structure.

Optionally, the light processing layer includes a first visible light absorption layer as a whole layer, wherein the polymer containing nonfullerene at the positions corresponding to sub-pixels of different colors has visible light absorption groups which could absorb light having colors other than that of the sub-pixels.

Optionally, a patterned second visible light absorption layer is arranged between adjacent sub-pixel units, wherein the polymer containing nonfullerene has visible light absorption group which could absorb visible light.

Optionally, the visible light absorption group includes at least one of a two-dimensional condensed-ring electron acceptor, a hepta-condensed ring electron acceptor, an octo-condensed ring electron acceptor, a nova-condensed ring electron acceptor, a deca-condensed ring electron acceptor, a undec-condensed ring electron acceptor, a bis-fluoro pyrrole borane derivative, a retinene-like structure, a condensation compound of isophthalic acid dimethyl or dimethyl terephthalate, and alkoxy acetophenone.

Optionally, the light processing layer also includes a light reflecting layer. The light reflecting layer may be used to reflect light having colors other than that of the sub-pixels.

Optionally, the light reflection layer is arranged on a side of the first visible light absorption layer towards the base substrate, and the light reflection layer has a reflection surface towards the first visible light absorption layer.

Optionally, the display substrate also includes a photoelectric conversion unit connected to both the control circuit layer and the light processing layer for converting the light absorbed by the light processing layer into electrical energy and providing the electrical energy to the control circuit layer.

Optionally, the photoelectric conversion unit comprises a solar electrode. An orthographic projection of the solar electrode in a plane of the substrate does not overlap with an orthographic projection of the multiple sub-pixel units in the plane of the substrate.

The present disclosure also provides a method for manufacturing the above display substrate, including a step for forming a light processing layer comprising a condensed-ring conjugated polymer at least on a side of the pixel layer away from the base substrate, wherein the light processing layer allows light emitted by sub-pixel units at corresponding positions to pass through and prevents at least partially other light.

The present disclosure also provides a display device including any of the above display substrates.

DETAILED DESCRIPTION OF EMBODIMENTS

To enable those skilled in the art better understand the technical solution of the present disclosure, the present disclosure is further described in details based on the attached drawings and specific embodiments.

Figure 1:
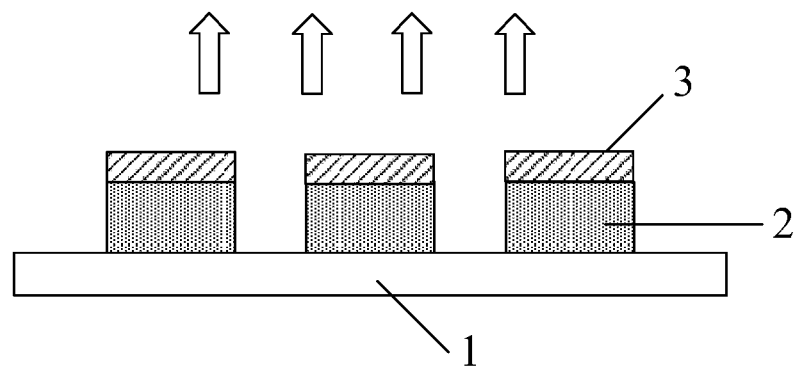
FIG. 1 schematically shows a structure diagram of a display substrate according to an embodiment disclosed herein.

Some embodiments of the present disclosure provide a display substrate, as shown in FIG. 1, including a base substrate 1, a pixel layer comprising multiple sub-pixel units 2 on a side of the base substrate 1, and a light processing layer 3 comprising a condensed-ring conjugated polymer at least on a side of the pixel layer away from the base substrate; wherein the light processing layer 3 allows light emitted by the sub-pixel units 2 at corresponding positions to pass through and prevents at least partially other light.

According to this embodiment, the display substrate is provided with the light processing layer 3 comprising a condensed-ring conjugated polymer at least on a side of the pixel layer away from the base substrate, wherein the light processing layer 3 play a role of protecting display parts below it and preventing the display parts from reducing their service life due to being exposed to ambient light.

Figure 2:
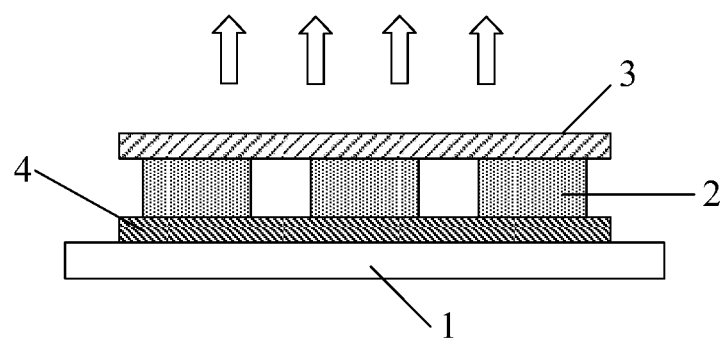
FIG. 2 schematically shows a structure diagram of a display substrate according to an embodiment disclosed herein.
Figure 3A:
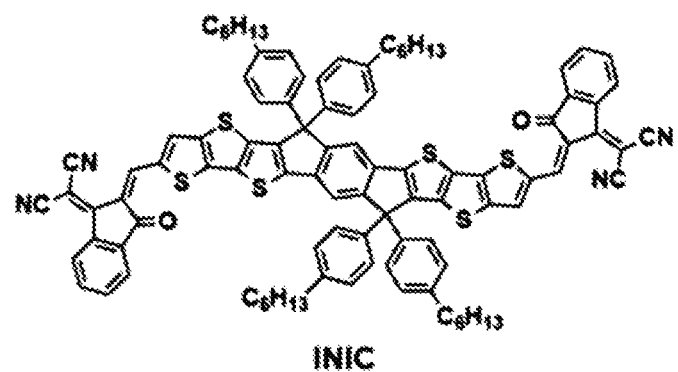
FIG. 3a schematically shows structure of a polymer INIC containing nonfullerene in the display substrate as shown in FIG. 2.
Figure 3B:
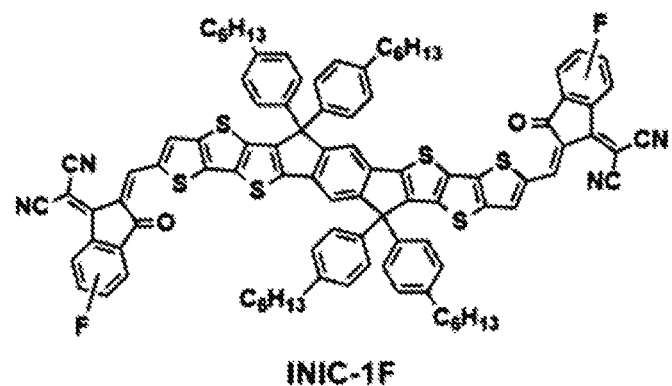
FIG. 3b schematically shows structure of a polymer INIC-1F containing nonfullerene in the display substrate as shown in FIG. 2.
Figure 3C:
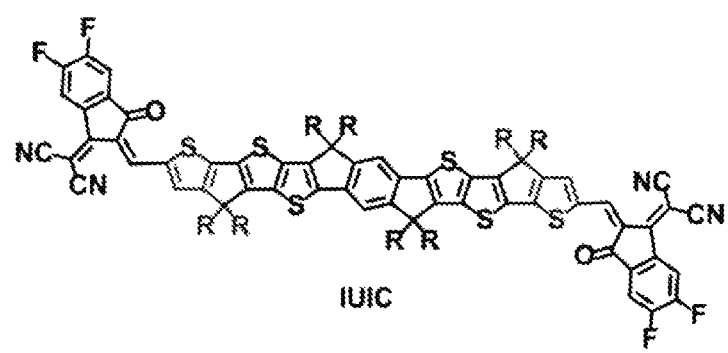
FIG. 3c schematically shows structure of a polymer IUIC containing non-fullerene in the display substrate as shown in FIG. 2.
Figure 3D:
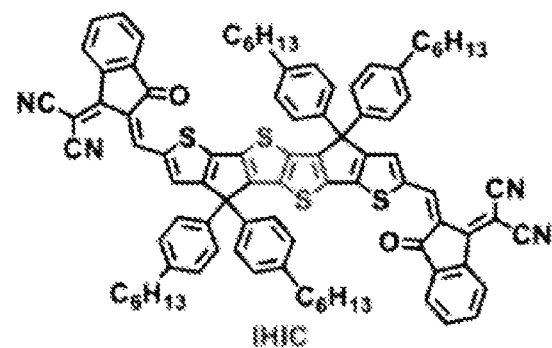
FIG. 3d schematically shows structure of a polymer IHIC containing non-fullerene in the display substrate as shown in FIG. 2.

Some embodiments of the present disclosure provide a display substrate, as shown in FIG. 2, including a base substrate 1, a pixel layer having multiple sub-pixel units 2 on a side of the base substrate 1, a control circuit layer 4 between the base substrate 1 and the pixel layer, and a light processing layer 3 comprising a condensed-ring conjugated polymer on a side of the pixel layer away from the base substrate; wherein the light processing layer 3 allows light emitted by the sub-pixel units 2 at corresponding positions to pass through and prevents at least partially other light.

The light processing layer 3 may comprise a single layer or multiple layers according to the wavelength range of the light to be prevented. For example, when the lights need to be prevented for the sub-pixel units 2 and the control circuit layer 4 have the same wavelength range, the light processing layer 3 may be a single layer as shown in FIG. 2. When the lights need to be prevented for the sub-pixel units 2 and the control circuit layer 4 have different wavelength ranges, the light processing layer 3 may comprise multiple layers which could prevent light having different wavelengths respectively.

As an optional embodiment of the present disclosure, the condensed-ring conjugated polymer is selected from polymers containing nonfullerene.

Polymers containing nonfullerene can be targeted for processing specific wavelengths of light. Polymers containing nonfullerene usually contain side chains or groups which could be modified, so the cores (or backbones, skeletons), end groups, and side chains of such condensed-ring conjugated polymers can be modified to form materials that deal with different spectra. Through patterning the materials that deal with different spectra, a corresponding light processing structure is formed. Specifically, the condensed-ring conjugated polymers used in the embodiments of the present disclosure include, but not limited to, an nona-condensed ring electron acceptor (INIC), a 1-fluoro nova-condensed ring electron acceptor (INIC-1F), an undec-condensed ring electron acceptor (IUIC), a hexa-condensed ring electron acceptor (INIC), as shown in FIG. 3a-3d, respectively.

The light processing layer 3 can process ambient light in different ways, for example, it can absorb the ambient light, block the ambient light, or reflect the ambient light in reflection manner. It processes the ambient light differently in a variety of different ways, so as to prevent the sub-pixel unit 2 and the control circuit layer 4 from being exposed to the ambient light.

Figure 4:
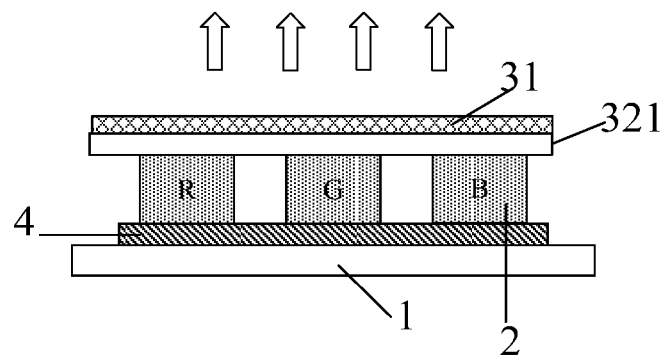
FIG. 4 schematically shows a structure diagram of a display substrate according to another embodiment disclosed herein.

In one embodiment, as shown in FIG. 4, the display substrate is an OLED substrate, and the light processing layer 3 includes an ultraviolet absorption layer 31 to prevent ultraviolet light.

The ultraviolet absorption layer 31 is used to absorb ultraviolet light in the ambient light, so as to avoid lifetime degradations of the control circuit layer 4 and the sub-pixel units 2 in the display substrate caused by the irradiation of ultraviolet light. Since ultraviolet absorption layer 31 has no effect on visible light, the visible light emitted by the sub-pixel units 2 can normally pass through the ultraviolet absorption layer 31. In this situation, the light processing layer 3 may only include an ultraviolet absorption layer set on a side of the sub-pixel units 2 away from the substrate.

The polymer containing nonfullerene in the ultraviolet absorption layer 31 includes ultraviolet absorption groups. The ultraviolet absorption groups include at least one of an amino acid group, a tryptophan group, a tyrosine group and a conjugated double-chain structure.

Optionally, the ultraviolet absorption layer 31 has a thickness of 20-50 nm. The ultraviolet absorption layer 31 can be distributed as a whole layer to improve the absorption efficiency of ultraviolet light and reduce the damage of ultraviolet light to the OLE© devices.

In other embodiments of this disclosure, the light processing layer 3 includes a first visible light absorption layer 321, wherein the polymers containing nonfullerene at positions corresponding to sub-pixels of different colors has visible light absorption groups for lights having colors other than each sub-pixel.

The first visible light absorption layer 321 is used to absorb the lights having colors other than each sub-pixel in the environment, so as to prevent the lights having colors other than each sub-pixel in the environment from irradiating the control circuit layer 4 and the sub-pixel units 2 of the substrate which normally reduce the lifetime of the control circuit layer 4 and the sub-pixel units 2.

Figure 5:
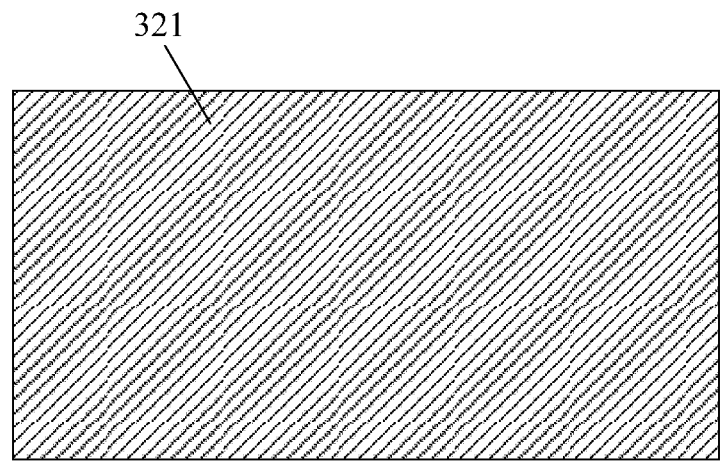
FIG. 5 shows a top view of the visible light absorption layer in the display substrate as shown in FIG. 4.

Specifically, as shown in FIG. 4 and FIG. 5, each sub-pixel unit 2 includes a red (R) sub-pixel unit, a green (G) sub-pixel and a blue (B) sub-pixel. The first visible light absorption layer 321 is disposed as a whole layer on a side of the sub-pixel unit 2 away from substrate 1. The absorption materials in the first visible light absorption layer 321 at positions corresponding to sub-pixels of different colors are different accordingly. For example, when the absorption materials in the first visible light absorption layer 321 at positions corresponding to the green or blue sub-pixels need to absorb red or infrared light, a material containing a side chain of 7 to 11-condensed ring electron acceptors or a two-dimensional condensed ring electron acceptor can be selected. When the absorption materials in the first visible light absorption layer 321 at positions corresponding to blue or red sub-pixels need to absorb green light, a material containing a bis-fluoro pyrrole borane derivative or a retinene-like structure can be selected, or a-Si can also be used as green light absorbing material. When the absorption materials in the first visible light absorption layer 321 at positions corresponding to red or green sub-pixels need to absorb blue light, a material containing alkoxy acetophenone or a condensation compound of isophthalic acid dimethyl or dimethyl terephthalate can be selected. In this case, the first visible light absorption layer 321 plays the same role as a color film.

Figure 6:
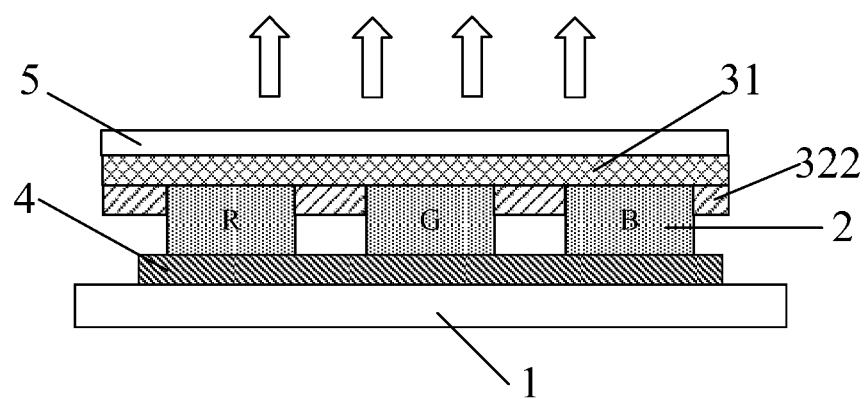
FIG. 6 schematically shows a structure diagram of a display substrate according to another embodiment disclosed herein.
Figure 7:
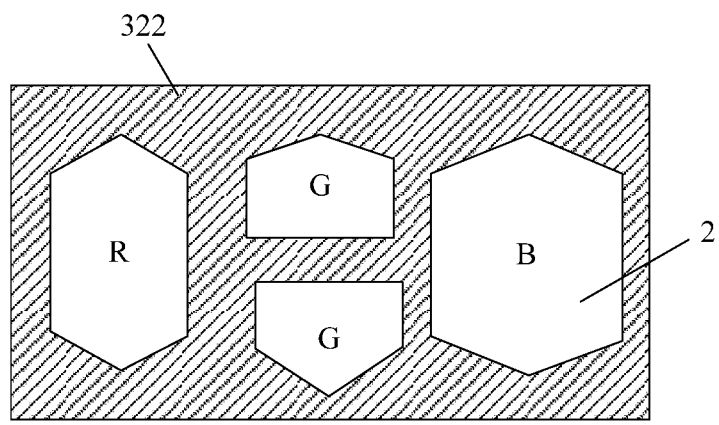
FIG. 7 shows a top view of the visible light absorption layer in the display substrate as shown in FIG. 6.

However, since the area of a sub-pixel is usually very small, a visible light absorption structure composed of different condensed-ring conjugated polymer materials for each sub-pixel is complicated to operate. In order to facilitate the manufacturing process for mass production, as shown in FIG. 6 and FIG. 7, a second visible light absorption layer 322 can be set between the adjacent sub-pixel units 2. The second visible light absorption layer 322 has a top view of hollow pattern. The second visible light absorption layer 322 can absorb all visible light and is used to protect the control circuit layer 4 below.

Optionally, the polymer containing nonfullerene of the second visible absorption layer 322 between the adjacent sub-pixel units 2 includes visible light absorption groups. The visible light absorption group includes at least one of a two-dimensional condensed-ring electron acceptor, a hepta-condensed ring electron acceptor, an octo-condensed ring electron acceptor, a nova-condensed ring electron acceptor, a deca-condensed ring electron acceptor, a undec-condensed ring electron acceptor, a bis-fluoro pyrrole borane derivative, a retinene-like structure, a condensation compound of isophthalic acid dimethyl or dimethyl terephthalate, and alkoxy acetophenone.

It should be noted that, the above side chains of polymers containing nonfullerene that can achieve the above functions are merely exemplary and is not intended to limit. In addition, other similar functional groups that can achieve the above processing functions on light in the specified wavelength range can also be used, and they are not exhaustive here.

Optionally, the display substrate of the present disclosure may also include a photoelectric conversion unit connected to both the control circuit layer 4 and the light processing layer 3, which is used to convert the ambient light absorbed by the light processing layer 3 into electrical energy and then provide the electrical energy to the control circuit layer 4.

That is to say, the light absorbing material in the light processing layer 3 can be applied as charging polymer at the same time. Since charging polymer can absorb light of corresponding color wavelength, it can absorb environmental light on one hand and convert light energy into electric energy to charge the devices on the other hand. In other words, the light processing layer 3 converts the absorbed ambient light into electric energy and then provides the electrical energy to the control circuit, thereby recycling the ambient light.

Figure 8:
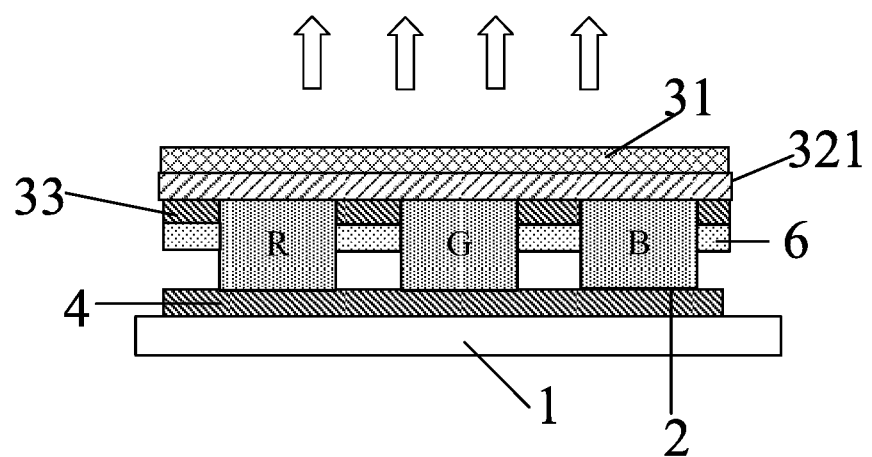
FIG. 8 schematically shows a structure diagram of a display substrate according to another embodiment disclosed herein.

In other embodiments disclosed herein, as shown in FIG. 8, the photoelectric conversion unit includes a solar electrode 6; wherein the solar electrode 6 has an orthographic projection not overlap with that of the sub-pixel units 2 in the plane of the base substrate 1.

In order to ensure conductivity and transparency of the solar electrode 6, the solar electrode 6 preferably is made of Ag, Optionally, the solar electrode 6 is a solar electrode layer with a thickness of 1 to 20 nm. The solar electrode layer 6 to substrate 1 has an orthographic projection not overlap with that of the sub-pixel units 2 in the plane of the base substrate 1, so as to not affect the light output of sub-pixel units 2. The solar electrode layer 6 may be patterned by etching or other means such as printing.

In some embodiments disclosed herein, the light processing layer 3 also includes a light reflection layer 33 which is used to reflect light having colors other than the sub-pixels. In other words, the ambient light is shielded in a reflection manner to avoid adverse effects on the sub-pixel unit 2 and/or the control circuit layer 4.

Specifically, as shown in FIG. 8, the light reflection layer 33 is set on a side of the first visible light absorption layer 321 towards the base substrate, and the reflection layer 33 has a reflection surface towards the first visible light absorption layer 321. In this way, the light reflection layer 33 reflects light to the light absorption layer, and the light absorption layer further recycles the reflected light and converts it into electric energy.

It should be noted that the display substrate of the present disclosure may also include other auxiliary layers 5 on a side of the light processing layer 3 away from the base substrate, such as an encapsulation layer comprising alternately stacked organic and/or inorganic layers, and the like.

When the disclosed display substrate is applied outdoors or under strong light, the various light processing layers 3 mentioned above could significantly improve resistance of the display devices to strong light. Even when used outdoors or under strong light, it can reduce the influence of ambient light on the service life of the device and greatly extend its service life.

The sizes and thicknesses of each layer shown in the attached drawings are only schematic. In the practical process, the projection area of each layer on the base substrate 1 may be the same or different. The desired projection area of each layer may be achieved by etching or other processes. Meanwhile, the structures shown in the attached drawings do not limit the geometric shape of each layer. For example, the geometric shape may be rectangle shown in the attached drawings or other shapes, such as trapezoid and the like, which can also be achieved through etching or other processes.

Figure 9:
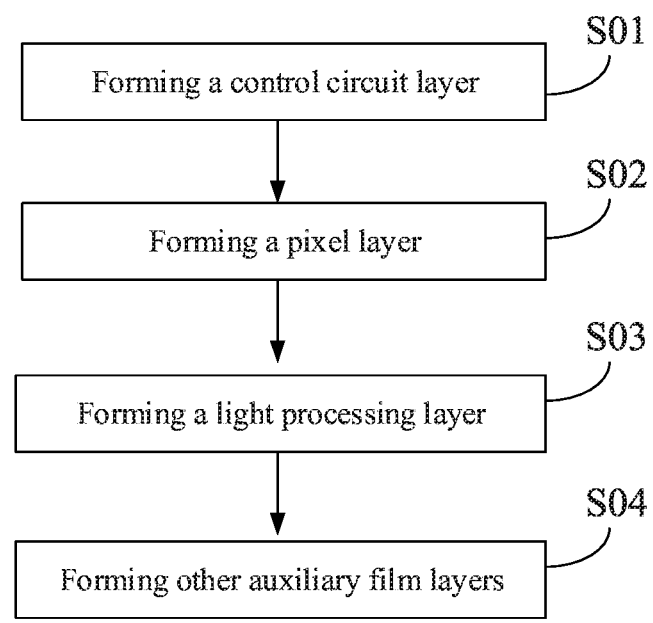
FIG. 9 shows a flow chart of a method for manufacturing a display substrate according to an embodiment disclosed herein.

Some embodiments disclosed herein also provide a method for manufacturing the display substrate, as shown in FIG. 9, including a step of forming a light processing layer comprising a condensed-ring conjugated polymer at least on a side of the pixel layer.

In particular, the method for manufacturing the display substrate according to an embodiment disclosed herein may include the following steps.

S01, optionally, forming a control circuit layer 4 on a base substrate 1.

Specifically, this step includes, but not limited to sub-steps of forming a buffer layer, a gate insulation layer, a gate electrode layer, an insulating interlayer, source and drain electrodes, a planarization layer, an anode layer, a pixel definition layer, a support layer and other functional layers.

Specific manufacture processes of the control circuit layer 4 are similar to the existing technology, and it will not be described herein.

S02, forming a pixel layer comprising multiple sub-pixel units 2 on the obtained base substrate 1.

The sub-pixel units 2 may be formed by inkjet printing to obtain a structure composed of a hole injection layer, a hole transport layer, an light-emitting material layer, an electron transport layer and an electron injection layer in the region defined by the pixel layer. The specific manufacture process of sub-pixel units 2 is similar to the existing technology, and it will not be described herein.

S03, forming a light processing layer 3 comprising a condensed-ring conjugated polymer on the obtained base substrate 1.

The light processing layer 3 allows the light emitted by the sub-pixel units 2 at corresponding positions to pass through and prevents at least partially other light. Specifically, forming a light processing layer 3 includes the following sub-steps.

S03a, optionally, forming a photoelectric conversion unit such as a solar electrode 6 and other structures.

The solar electrode 6 is preferably made of Ag. The solar electrode 6 may be formed as a layer having a thickness of 1 to 20 nm; wherein the solar electrode 6 has an orthographic projection not overlap with that of the sub-pixel units 2 in the plane of the base substrate 1, so as to not affect the light output of the sub-pixel units 2.

S03b, optionally, forming a light reflection layer 33.

The reflection layer 33 plays a role of shielding the ambient light by the way of reflection, so as to avoid the adverse effect of the ambient light on the sub-pixel units 2 and/or the control circuit layer 4.

S03c, forming a first visible light absorption layer 321 by coating a condensed-ring conjugated polymer and curing it.

The first visible light absorption layer 321 can absorb the ambient lights having colors other than the sub-pixels and thus prevent these lights from irradiating the control circuit layer 4 and the sub-pixel units 2 in the display substrate, thereby extending the lifetime of the control circuit layer 4 and the sub-pixel units 2.

S03d, forming an ultraviolet absorption layer 31 having a thickness of 20-50 nm.

The ultraviolet absorption layer 31 is used to absorb ultraviolet light in the environment, so as to avoid ultraviolet light irradiation on the control circuit layer 4 and the sub-pixel units 2 in the display substrate, thereby extending the lifetime of the control circuit layer 4 and the sub-pixel units 2. Specifically, the ultraviolet absorption layer 31 may be formed as a whole layer, which improve the absorption of ultraviolet light, thereby further reducing the damage to OLED devices due to ultraviolet radiation and improve the utilization efficiency of solar energy.

S04, optionally, forming other auxiliary film layers on the obtained base substrate 1. Other auxiliary film layers may include structures such as an encapsulation layer comprising alternately stacked organic and/or inorganic layers According to another embodiment disclosed herein, in Step S03c, a patterned second visible light absorption layer 322 is formed between the adjacent sub-pixel units 2 to replace the first visible light absorption layer 321. Here, the second visible light absorption layer 322 can absorb all visible light in the environment and avoid the irradiation of visible light on the control circuit layer 4 and the sub-pixel units 2 in the display substrate, thereby extending the lifetime of the control circuit layer 4 and the sub-pixel units 2.

Some embodiments disclosed herein also provide a display device comprising any of the above display substrates.

The display device may be an electronic paper, an OLED panel, a mobile phone, a tablet computer, a TV set, a monitor, a laptop computer, a digital photo frame, a navigator and any other products or components with display function.

It is understood that the above embodiments are only exemplary embodiments used to illustrate the principles of the invention, but the invention is not limited to them. For ordinary skilled in the art, various variations and improvements can be made without breaking away from the spirit and essence of the invention, which are also regarded as the protection scope of the invention.

The invention claimed is:

1. A display substrate, comprising a base substrate, a pixel layer comprising multiple sub-pixel units on a side of the base substrate, and a light processing layer comprising a condensed-ring conjugated polymer at least on a side of the pixel layer away from the base substrate,
   wherein the light processing layer allows light emitted by the sub-pixel units at corresponding positions to pass through and prevents at least partially other light,
   wherein the light processing layer includes a first visible light absorption layer as a whole layer, and a polymer containing nonfullerene in the first visible light absorption layer has visible light absorption groups for light having colors other than the sub-pixels at corresponding positions, wherein the visible light absorption groups include at least one of a two-dimensional condensed-ring electron acceptor, a hepta-condensed ring electron acceptor, an octo-condensed ring electron acceptor, a nona-condensed ring electron acceptor, a deca-condensed ring electron acceptor, a undec-condensed ring electron acceptor, a bis-fluoro pyrrole borane derivative, a retinene-like structure, a condensation compound of isophthalic acid dimethyl or dimethyl terephthalate, and alkoxy acetophenone,
   wherein the display substrate further comprises a control circuit layer between the base substrate and the pixel layer,
   wherein the display substrate also includes a photoelectric conversion unit connected to both the control circuit layer and the light processing layer for converting the light absorbed by the light processing layer into electrical energy and providing the electrical energy to the control circuit layer,
   wherein the photoelectric conversion unit includes a solar electrode which has an orthographic projection not overlap with the orthographic projection of the multiple sub-pixel units in the plane of the base substrate.

2. The display substrate according to claim 1, wherein the condensed-ring conjugated polymer includes a polymer containing nonfullerene.

3. The display substrate according to claim 1, wherein the display substrate is an OLED substrate and the light processing layer includes an ultraviolet absorption layer comprising a polymer containing nonfullerene.

4. The display substrate according to claim 3, wherein the polymer containing nonfullerene of the ultraviolet absorption layer has an ultraviolet absorption group, and the ultraviolet absorption group includes at least one of an amino acid group, a tryptophan group, a tyrosine group and a conjugated double-chain structure.

5. The display substrate according to claim 3, wherein the ultraviolet absorption layer has a thickness of 20-50 nm.

6. The display substrate according to claim 1, wherein the light processing layer includes a patterned second visible light absorption layer between the adjacent sub-pixel units, and the polymer containing nonfullerene therein has visible light absorption groups.

7. The display substrate according to claim 1, wherein the visible light absorption groups include at least one of a two-dimensional condensed-ring electron acceptor, a hepta-condensed ring electron acceptor, an octo-condensed ring electron acceptor, a nona-condensed ring electron acceptor, a deca-condensed ring electron acceptor, a undec-condensed ring electron acceptor, a bis-fluoro pyrrole borane derivative, a retinene-like structure, a condensation compound of isophthalic acid dimethyl or dimethyl terephthalate, and alkoxy acetophenone.

8. The display substrate according to claim 1, wherein the first visible light absorption layer has a thickness of 50-5000 nm.

9. The display substrate according to claim 6, wherein the second visible light absorption layer has a thickness of 50-5000 nm.

10. The display substrate according to claim 1, wherein the light processing layer further includes a light reflecting layer.

11. The display substrate according to claim 10, wherein the light reflection layer is arranged on a side of the first visible light absorption layer towards the base substrate, and the light reflection layer has a reflection surface towards the first visible light absorption layer.

12. A method for manufacturing the display substrate of claim 1, including a step of forming a light processing layer comprising a condensed-ring conjugated polymer at least on a side of the pixel layer away from the base substrate; wherein the light processing layer allows light emitted by the sub-pixel units at corresponding positions to pass through and prevents at least partially other light.

13. A display device, including the display substrate according to claim 1.

* * * * *